United States Patent
Sakaguchi et al.

(10) Patent No.: US 9,184,367 B2
(45) Date of Patent: Nov. 10, 2015

(54) ELASTIC WAVE DEVICE

(71) Applicant: Murata Manufacturing Co., Ltd., Nagaokakyo-shi, Kyoto-fu (JP)

(72) Inventors: Kenji Sakaguchi, Nagaokakyo (JP); Shin Saijo, Nagaokakyo (JP); Hisashi Yamazaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 496 days.

(21) Appl. No.: 13/798,206

(22) Filed: Mar. 13, 2013

(65) Prior Publication Data

US 2013/0207514 A1    Aug. 15, 2013

Related U.S. Application Data

(63) Continuation of application No. PCT/JP2011/070919, filed on Sep. 14, 2011.

(30) Foreign Application Priority Data

Sep. 17, 2010    (JP) .................................. 2010-209517

(51) Int. Cl.
   *H03H 9/25*      (2006.01)
   *H01L 41/047*    (2006.01)
   *H03H 9/02*      (2006.01)
   *H03H 9/145*     (2006.01)

(52) U.S. Cl.
   CPC .......... *H01L 41/047* (2013.01); *H03H 9/0222* (2013.01); *H03H 9/02818* (2013.01); *H03H 9/14541* (2013.01)

(58) Field of Classification Search
   CPC ...................................................... G06G 7/195
   USPC .............. 310/313 R, 313 A–313 D, 363–366; 333/193–196
   See application file for complete search history.

(56) References Cited

U.S. PATENT DOCUMENTS

| | | |
|---|---|---|
| 6,297,580 B1 | 10/2001 | Takayama et al. |
| 2006/0175639 A1 | 8/2006 | Leidl et al. |
| 2007/0120439 A1 | 5/2007 | Kadota et al. |
| 2007/0176711 A1 | 8/2007 | Kando |
| 2010/0164646 A1 | 7/2010 | Nakanishi et al. |
| 2012/0133246 A1* | 5/2012 | Yaoi et al. ................. 310/313 C |

FOREIGN PATENT DOCUMENTS

| | | |
|---|---|---|
| JP | 09-083030 A | 3/1997 |
| JP | 10-247835 A | 9/1998 |
| JP | 11-163661 A | 6/1999 |
| JP | 2005-518127 A | 6/2005 |
| WO | 99/54995 A1 | 10/1999 |
| WO | 2006/011417 A1 | 2/2006 |
| WO | 2006/123585 A1 | 11/2006 |
| WO | 2007/094368 A1 | 8/2007 |
| WO | 2010/016192 A1 | 2/2010 |

OTHER PUBLICATIONS

Official Communication issued in International Patent Application No. PCT/JP2011/070919, mailed on Oct. 11, 2011.

* cited by examiner

*Primary Examiner* — Thomas Dougherty
(74) *Attorney, Agent, or Firm* — Keating & Bennett, LLP

(57) ABSTRACT

An elastic wave device includes a piezoelectric substrate and an interdigital transducer electrode. The piezoelectric substrate includes a principal surface with a groove tapered in lateral cross section. The interdigital transducer electrode is arranged on the principal surface such that at least one portion thereof is located in the groove. The interdigital transducer electrode is a laminate including a first conductive layer, a second conductive layer, and a diffusion-preventing layer located between the first conductive layer and the second conductive layer and made of an oxide or nitride of Ti or Cr.

20 Claims, 4 Drawing Sheets

ELASTIC WAVE DEVICE

BACKGROUND OF THE INVENTION

1. Field of the Invention

The present invention relates to elastic wave devices. In particular, the present invention relates to an elastic wave device in which at least one portion of an interdigital transducer electrode is embedded in a groove located in a piezoelectric substrate.

2. Description of the Related Art

Conventionally, elastic wave devices using elastic waves such as surface acoustic waves and boundary acoustic waves have been widely used as resonators or filter devices. For example, International Publication No. WO 2006/011417 A1 proposes a surface acoustic wave device in which an interdigital transducer electrode including a laminate of a plurality of conductive films is entirely embedded in a groove formed in a piezoelectric substrate. Since the interdigital transducer electrode is entirely embedded in the groove as described in International Publication No. WO 2006/011417 A1, a surface of an insulating layer covering the interdigital transducer electrode can be planarized. As a result, the insertion loss can be reduced. International Publication No. WO 2006/011417 A1 further describes that the groove, in which the interdigital transducer electrode is embedded, has a trapezoidal shape, in lateral cross section, tapered toward the piezoelectric substrate side.

However, in the case where at least one portion of an interdigital transducer electrode is located in a tapered groove formed in a piezoelectric substrate and the interdigital transducer electrode is composed of a laminate of a plurality of conductive films, there is a problem in that it is difficult to sufficiently improve the electrical resistance of electrode fingers or characteristics, such as frequency characteristics and electric power handling capability, of an elastic wave device because an electrode formed on a sloped portion of a groove has reduced crystallinity.

SUMMARY OF THE INVENTION

In view of the above, preferred embodiments of the present invention provide an elastic wave device having excellent characteristics such as electric power handling capability. The elastic wave device includes an interdigital transducer electrode including at least one portion located in a groove provided in a piezoelectric substrate and which is tapered in lateral cross section, the interdigital transducer electrode including a laminate of a plurality of conductive films.

An elastic wave device according to a preferred embodiment of the present invention includes a piezoelectric substrate and an interdigital transducer electrode. The piezoelectric substrate includes a principal surface. The principal surface includes a groove tapered in lateral cross section. The interdigital transducer electrode is arranged on the principal surface such that at least one portion thereof is located in the groove. The interdigital transducer electrode preferably is a laminate including a first conductive layer, a second conductive layer, and a diffusion-preventing layer. The diffusion-preventing layer is located between the first conductive layer and the second conductive layer. The diffusion-preventing layer is preferably made of an oxide or nitride of Ti or Cr, for example.

In a specific aspect of the elastic wave device according to a preferred embodiment of the present invention, the first conductive layer includes a central portion in a width direction of the groove and two end portions inclined relative to the central portion and the second conductive layer is located above the central portion and two end portions of the first conductive layer with the diffusion-preventing layer disposed therebetween.

In another specific aspect of the elastic wave device according to a preferred embodiment of the present invention, the first conductive layer is preferably made of Al or an Al alloy and the second conductive layer is made of a metal or alloy higher in density than Al, for example.

In another specific aspect of the elastic wave device according to a preferred embodiment of the present invention, the second conductive layer is preferably made of a metal selected from the group consisting of Pt, Au, Cu, Ag, and Pd or an alloy containing one or more metals selected from the group consisting of Pt, Au, Cu, Ag, and Pd, for example.

Furthermore, in another specific aspect of the elastic wave device according to a preferred embodiment of the present invention, the elastic wave device is a surface acoustic wave device.

Furthermore, in another specific aspect of the elastic wave device according to a preferred embodiment of the present invention, the elastic wave device is a boundary acoustic wave device.

According to various preferred embodiments of the present invention, a diffusion-preventing layer located between a first conductive layer and a second conductive layer preferably is made of an oxide or nitride of Ti or Cr. Thus, interdiffusion between the first conductive layer and the second conductive layer can be effectively suppressed. As a result, characteristics such as electric power handling capability can be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A preferred embodiment of the present invention is described below using a so-called three medium-type boundary acoustic wave device 1 shown in FIG. 1 as an example.

The boundary acoustic wave device 1 is an example only. An elastic wave device according to the present invention is not limited to the boundary acoustic wave device 1.

Figure 1:
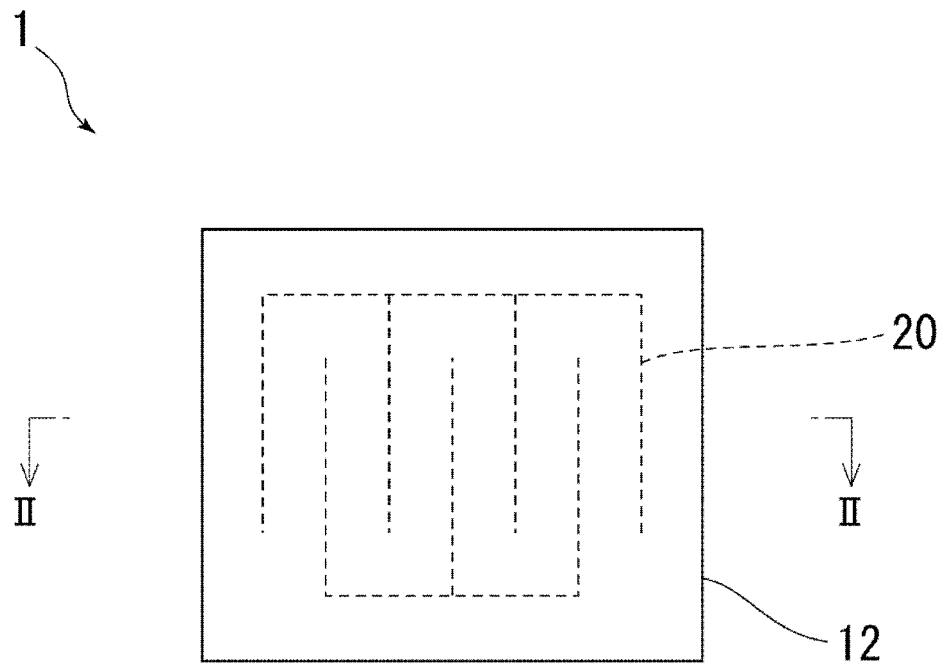
FIG. 1 is a schematic plan view of a boundary acoustic wave device according to a first preferred embodiment of the present invention.
Figure 2:
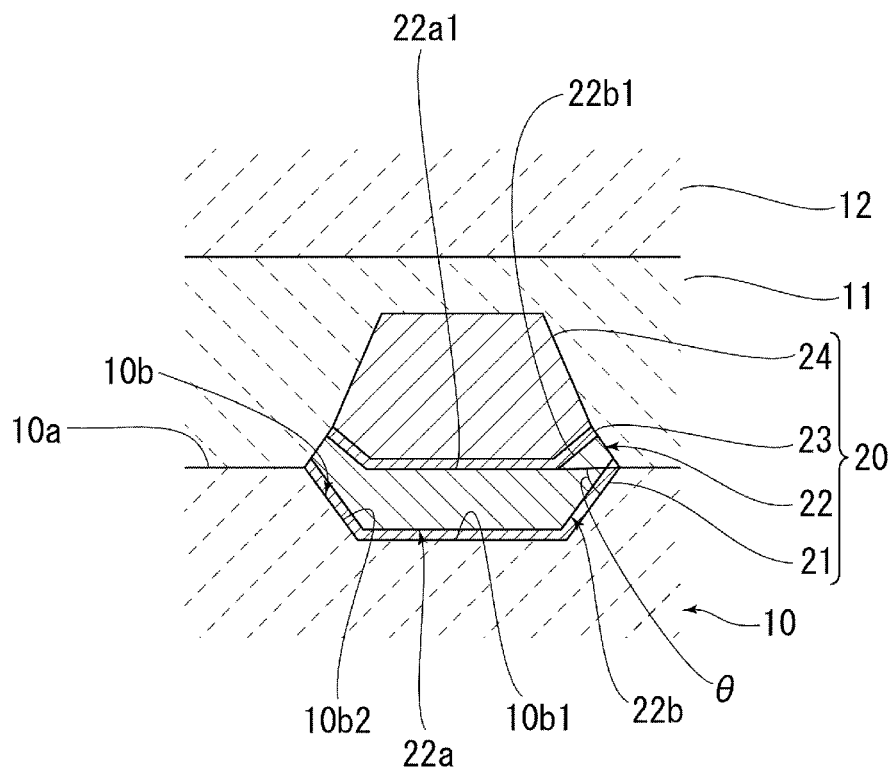
FIG. 2 is a schematic sectional view taken along the line II-II of FIG. 1.

FIG. 1 is a schematic plan view of a boundary acoustic wave device according to a first preferred embodiment of the present invention. FIG. 2 is a schematic sectional view taken along the line II-II of FIG. 1. The configuration of the boundary acoustic wave device 1 is described with reference to FIGS. 1 and 2.

With reference to FIG. 2, the boundary acoustic wave device 1 includes a piezoelectric substrate 10. The piezoelectric substrate 10 can be composed of a substrate made of an appropriate piezoelectric. The piezoelectric substrate 10 can be composed of, for example, a $LiNbO_3$ substrate, a $LiTaO_3$ substrate, a quartz substrate, or the like.

The piezoelectric substrate 10 includes a principal surface 10a including a groove 10b. The groove 10b is tapered in lateral cross section. In particular, in this preferred embodiment, the groove 10b preferably is trapezoidal in lateral cross section, for example. However, in the present invention, the shape of the lateral cross section of the groove is not limited to a trapezoidal shape. The lateral cross section of the groove may have, for example, a trapezoidal shape in which at least one of two corners is chamfered or R-chamfered or may have a semi-circular shape, a semi-oval shape, a semi-elliptical shape, or other suitable shape.

When the groove 10b is trapezoidal in lateral cross section, the groove 10b preferably has a base angle 8 of, for example, about 45° to about 90° and more preferably about 50° to about 80°.

An interdigital transducer electrode 20 is located on the principal surface 10a of the piezoelectric substrate 10. Furthermore, a first dielectric layer 11 is arranged on the principal surface 10a so as to cover the interdigital transducer electrode 20. A second dielectric layer 12 is arranged on the first dielectric layer 11. The boundary acoustic wave device 1 according to this preferred embodiment preferably is a three medium-type boundary acoustic wave device as described above. The elastic wave device according to other preferred embodiments of the present invention may be, for example, a so-called two medium-type boundary acoustic wave device including a first dielectric layer only.

The first dielectric layer 11 has an acoustic velocity less than an acoustic velocity of the second dielectric layer 12. Therefore, when the second dielectric layer 12 is made of, for example, silicon nitride, the first dielectric layer 11 may be made of a material, such as silicon oxide, having an acoustic velocity less than that of silicon nitride.

In this preferred embodiment, at least one portion of the interdigital transducer electrode 20 is located in the groove 10b. That is, at least one portion of the interdigital transducer electrode 20 is embedded in the groove 10b. In particular, in this preferred embodiment, a portion of the interdigital transducer electrode 20 is located in the groove 10b.

The interdigital transducer electrode 20 preferably is a laminate including an adhesive layer 21, a first conductive layer 22, a diffusion-preventing layer 23, and a second conductive layer 24 stacked from the piezoelectric substrate 10 side in that order.

The adhesive layer 21 is a layer that increases the adhesion of the interdigital transducer electrode 20 to the piezoelectric substrate 10. The adhesive layer 21 may be made of, for example, Ti or other suitable material. The thickness of the adhesive layer 21 is not particularly limited and may be, for example, about 10 nm to about 20 nm. The adhesive layer 21 may be conductive or non-conductive. From the viewpoint of increasing the conductivity of the interdigital transducer electrode 20, the adhesive layer 21 is preferably conductive.

The first conductive layer 22 is disposed on the adhesive layer 21. The second conductive layer 24 is disposed above the first conductive layer 22 with the diffusion-preventing layer 23 located therebetween.

In this preferred embodiment, the first conductive layer 22 is preferably made of Al or an Al alloy, for example. On the other hand, the second conductive layer 24 is preferably made of a metal or alloy higher in density than Al, for example. In particular, the second conductive layer 24 is preferably made of a metal selected from the group consisting of Pt, Au, Cu, Ag, and Pd or an alloy containing one or more metals selected from the group consisting of Pt, Au, Cu, Ag, and Pd, for example. The first and second conductive layers 22 and 24 are not particularly limited in thickness and may have a thickness of about 100 nm to about 300 nm and a thickness of about 10 nm to about 100 nm, respectively, for example.

In this preferred embodiment, the groove 10b preferably is tapered in lateral cross section as described above. Therefore, the first conductive layer 22, which is located in the groove 10b, has a shape corresponding to the groove 10b. In particular, the first conductive layer 22 includes a central portion 22a including a surface 22a1 parallel or substantially parallel to a bottom surface 10b1 of the groove 10b and two side portions 22b which are located on widthwise end portions of the groove 10b, which include surfaces 22b1 parallel or substantially parallel to side surfaces 10b2 inclined relative to the bottom surface 10b1, and which are inclined relative to the bottom surface 10b1. The two side portions 22b are inclined relative to the central portion 22a.

The diffusion-preventing layer 23 is disposed over the whole of the first conductive layer 22 that includes the surfaces 22a1 and 22b1. The second conductive layer 24 is disposed over the diffusion-preventing layer 23.

In this preferred embodiment, the diffusion-preventing layer 23 is preferably made of an oxide or nitride of Ti or Cr, for example. That is, the diffusion-preventing layer 23 is preferably made of titanium oxide, titanium nitride, titanium oxynitride, chromium oxide, chromium nitride, or chromium oxynitride.

A non-limiting example of a method for manufacturing the boundary acoustic wave device 1 is described below.

First, the piezoelectric substrate 10 including the groove 10b is prepared. The groove 10b can be formed by, for example, photolithography using a mask made of a photoresist.

Figure 3:
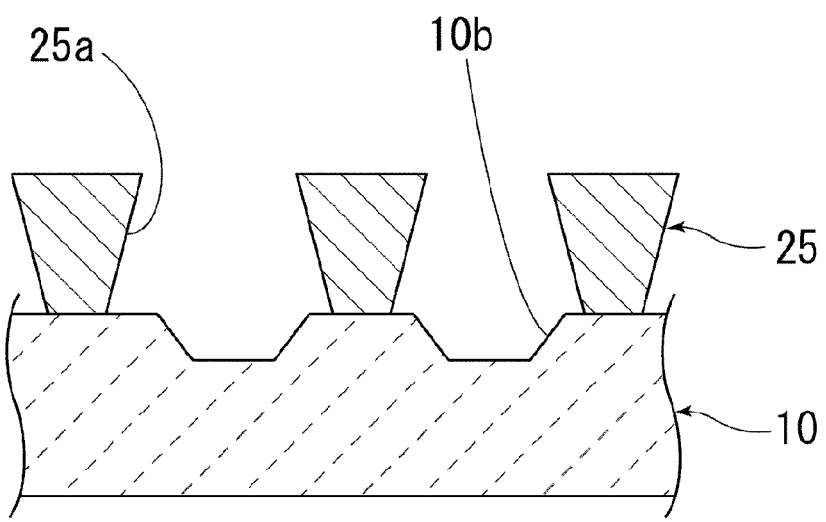
FIG. 3 is a schematic sectional view illustrating a step of manufacturing the boundary acoustic wave device according to the first preferred embodiment of the present invention.

Next, as shown in FIG. 3, the following mask is provided on the piezoelectric substrate 10: a mask 25 having an opening 25a located at a position where the interdigital transducer electrode 20 is to be formed. The mask 25 can be formed from, for example, a photoresist or the like.

Next, the adhesive layer 21, the first conductive layer 22, the diffusion-preventing layer 23, and the second conductive layer 24 are formed through the mask 25 by, for example, a thin-film forming process such as a vapor deposition process, a sputtering process, or a CVD (chemical vapor deposition) process. Thereafter, the mask 25 is removed (lifted off).

Finally, the first and second dielectric layers 11 and 12 are formed by, for example, a thin-film forming process such as a sputtering process or a CVD process, whereby the boundary acoustic wave device 1 can be completed.

In general, a Ti film is conventionally used as a diffusion-preventing layer. Unlike metal oxide films, the Ti film is conductive and therefore the conductivity of an interdigital transducer electrode is unlikely to be reduced. In the case where the interdigital transducer electrode is formed on a flat surface of a piezoelectric substrate that has no groove, a sufficient high diffusion-preventing effect can be obtained.

Therefore, in the case of forming an interdigital transducer electrode on a groove tapered in lateral cross section as described in this preferred embodiment, it is conceivable that a Ti film is used as a diffusion-preventing layer. However, in the case of forming the interdigital transducer electrode on the groove tapered in lateral cross section, the following problem has arisen: a problem that the use of a Ti film as a diffusion-preventing layer is not effective in obtaining a sufficient diffusion-preventing effect and therefore causes interdiffusion between conductive films present on upper and lower portions of a diffusion-preventing layer. The inventors have intensively investigated this problem to discover that the whole of the diffusion-preventing layer does not have a low diffusion-preventing function but a sloped portion of the diffusion-preventing layer has a low diffusion-preventing function. This is probably because the sloped portion of the diffusion-preventing layer is likely to have lower film quality and lower crystallinity as compared to a flat portion thereof.

Therefore, the inventors have investigated a diffusion-preventing layer that can effectively prevent interdiffusion between conductive films even in the case of forming an interdigital transducer electrode on a groove tapered in lateral cross section. As a result, the inventors have discovered that interdiffusion between the first conductive layer 22 and the second conductive layer 24 can be effectively prevented such that the diffusion-preventing layer 23, which is located between the first conductive layer 22 and the second conductive layer 24, is formed from an oxide or nitride of Ti or Cr as described in this preferred embodiment. That is, in a sloped portion of the diffusion-preventing layer 23, a good diffusion-preventing effect can be obtained such that the diffusion-preventing layer 23 is formed from an oxide or nitride of Ti or Cr.

Furthermore, a good diffusion-preventing effect can be obtained even when the diffusion-preventing layer 23 is thin. This allows the first and second conductive layers 22 and 24 to be thick. Thus, the electrical resistance of the interdigital transducer electrode 20 can be further reduced.

Interdiffusion is likely to occur between the first and second conductive layers 22 and 24 when heat is applied thereto. Thus, interdiffusion between the first and second conductive layers 22 and 24 is likely to be a big problem for the boundary acoustic wave device 1, in which the first dielectric layer 11 is formed on the interdigital transducer electrode 20.

This effect is described below in detail on the basis of a particular example and comparative example.

EXAMPLE

Figure 4:
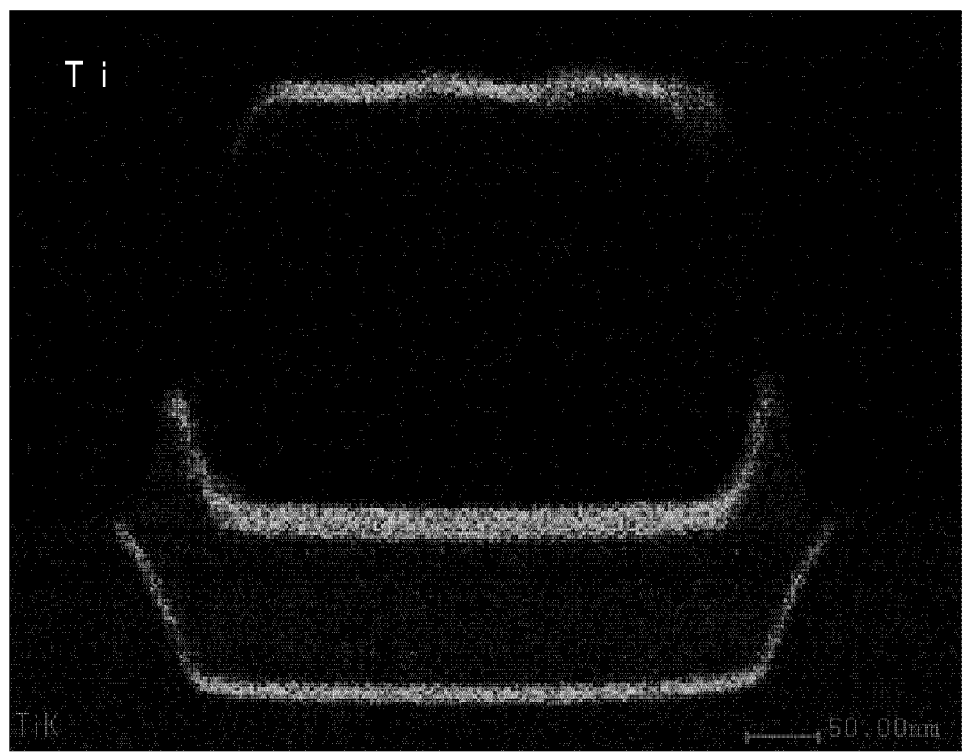
FIG. 4 is a TEM photograph illustrating the concentration of Ti present in an interdigital transducer electrode of a boundary acoustic wave device prepared in an example of a preferred embodiment of the present invention.

An example of the boundary acoustic wave device 1 according to the first preferred embodiment was prepared under conditions below. The concentration of present Ti was detected using a TEM. Results are shown in FIG. 4. In FIG. 4, light areas are portions where the concentration of present Ti is high.

Figure 5:
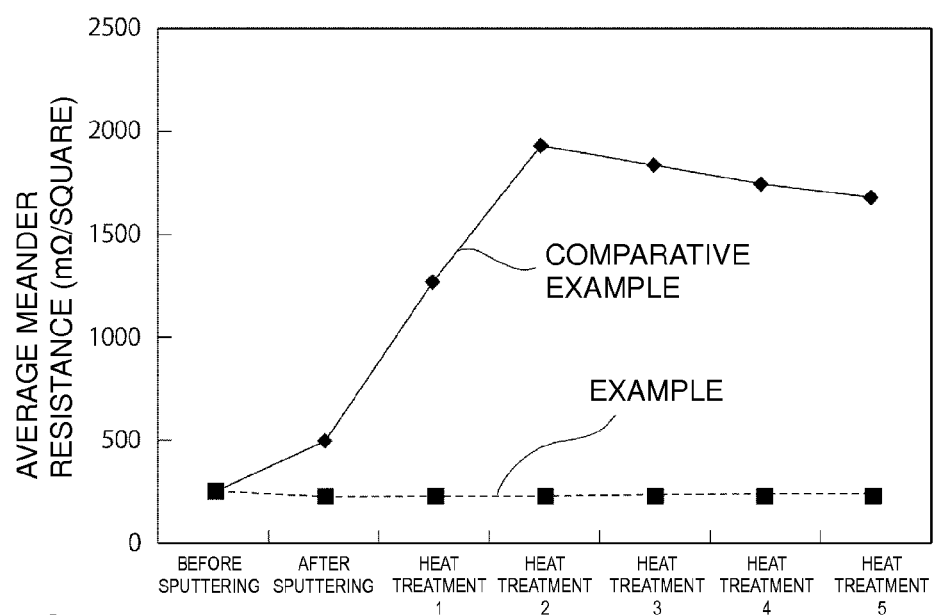
FIG. 5 is a graph illustrating the average meander resistance of an interdigital transducer electrode prepared in an example and that in a comparative example.

The average meander resistance of an interdigital transducer electrode was measured before and after a first dielectric layer was formed. The boundary acoustic wave device was heat-treated at 300° C. for two hours five times and the average meander resistance of the interdigital transducer electrode was measured after each heat treatment. Results are shown in FIG. 5.

Conditions of Example
   Piezoelectric substrate: LiTaO$_3$
   Adhesive layer: a Ti film with a thickness of 10 nm
   First conductive layer: an Al film, having a thickness of 300 nm, containing 1% by weight of Cu
   Diffusion-preventing layer: a titanium oxide film with a thickness of 20 nm
   Second conductive layer: a Pt film with a thickness of 95 nm
   First dielectric layer: a silicon oxide film with a thickness of 760 nm
   Second dielectric layer: a silicon nitride film with a thickness of 2,200 nm

COMPARATIVE EXAMPLE

Figure 6:
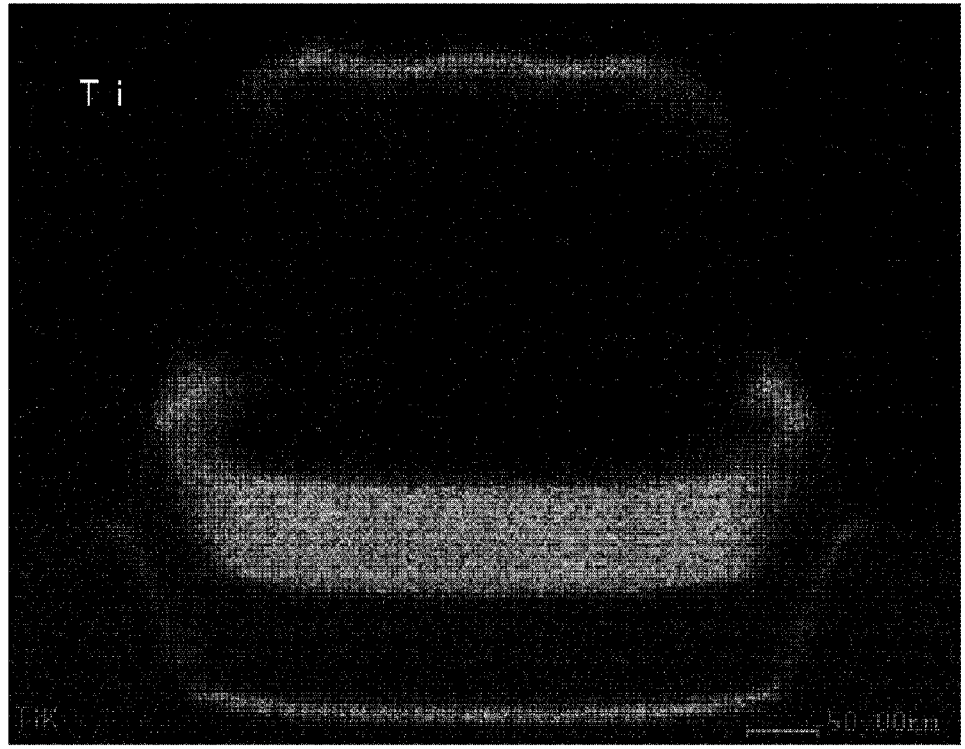
FIG. 6 is a TEM photograph illustrating the concentration of Ti present in an interdigital transducer electrode of a boundary acoustic wave device prepared in a comparative example.

A boundary acoustic wave device was prepared in substantially the same manner as that described in the example except that a diffusion-preventing layer was a Ti film with a thickness of 80 nm. The concentration of present Ti was detected with the TEM and the average meander resistance was measured by substantially the same procedure as above. FIG. 6 shows a TEM photograph illustrating the concentration of Ti present in an interdigital transducer electrode formed in the comparative example. FIG. 5 shows the average meander resistance determined in the comparative example.

From a comparison between FIGS. 4 and 6, when a diffusion-preventing layer is composed of a Ti film, portions having low Ti concentration are observed at two sloped end portions; however, when a diffusion-preventing layer is composed of a titanium oxide film, no portions having low Ti concentration are observed at two sloped end portions. This result shows that interdiffusion occurs between a first and a second conductive layer when that diffusion-preventing layer is composed of the Ti film but substantially no interdiffusion occurs between a first and a second conductive layer when this diffusion-preventing layer is composed of the titanium oxide film.

Results shown in FIG. 5 show that in the comparative example in which the diffusion-preventing layer is composed of the Ti film, interdiffusion occurs between the first and second conductive layers and the electrical resistivity of the interdigital transducer electrode increases when heat is applied to the interdigital transducer electrode. However, in the example in which the diffusion-preventing layer is composed of the titanium oxide film, no interdiffusion occurs between the first and second conductive layers and the electrical resistivity of the interdigital transducer electrode hardly increases when heat is applied to the interdigital transducer electrode. Substantially the same effect as above is obtained not only when the diffusion-preventing layer is the titanium oxide film but also when a diffusion-preventing layer is made of titanium nitride, titanium oxynitride, chromium oxide, chromium nitride, or chromium oxynitride.

In the above-described preferred embodiment, the case where a portion of the interdigital transducer electrode 20 preferably is embedded in the groove 10b has been described. However, the present invention is not limited to this configuration. For example, substantially the whole of the interdigital transducer electrode may be embedded in the groove.

In the present invention, the adhesive layer is not necessarily essential. The first conductive layer may be directly formed on the groove 10b without forming the adhesive layer, for example.

The interdigital transducer electrode may further include an additional conductive layer in addition to the first and second conductive layers. In this case, a diffusion-preventing layer made of an oxide or nitride of Ti or Cr is preferably further provided between the additional conductive layer and a conductive layer adjacent thereto.

Figure 7:
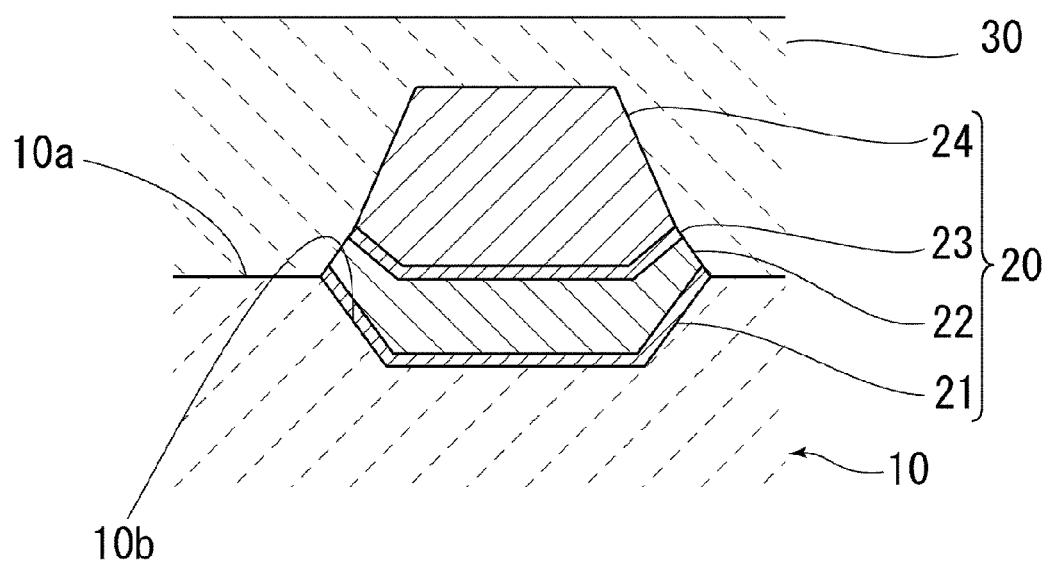
FIG. 7 is a schematic sectional view of a surface acoustic wave device according to a second preferred embodiment of the present invention.

In the first preferred embodiment, a preferred embodiment of the present invention has been described using the boundary acoustic wave device 1 as an example. An elastic wave device according to a preferred embodiment of the present invention may be, for example, a surface acoustic wave device shown in FIG. 7. In the surface acoustic wave device shown in FIG. 7, a protective film 30 having a function of improving frequency-temperature characteristics is disposed on a principal surface 10a of a piezoelectric substrate 10. The protective film can be formed from, for example, silicon oxide or other suitable material. However, the protective film is not necessarily essential for the surface acoustic wave device. In the surface acoustic wave device, no protective film may be provided and a surface of the piezoelectric substrate that has an interdigital transducer electrode may be exposed.

While preferred embodiments of the present invention and modifications thereof have been described above, it is to be understood that variations and additional modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric substrate including a principal surface including a groove tapered in lateral cross section; and
    an interdigital transducer electrode arranged on the principal surface such that at least one portion thereof is located in the groove; wherein
    the interdigital transducer electrode includes a laminate including a first conductive layer, a second conductive layer, and a diffusion-preventing layer that is located between the first conductive layer and the second conductive layer and is made of an oxide or nitride of Ti or Cr.

2. The elastic wave device according to claim 1, wherein the first conductive layer includes a central portion in a width direction of the groove and two end portions inclined relative to the central portion and the second conductive layer is located above the central portion and two end portions of the first conductive layer with the diffusion-preventing layer disposed therebetween.

3. The elastic wave device according to claim 1, wherein the first conductive layer is made of Al or an Al alloy and the second conductive layer is made of a metal or an alloy that is higher in density than Al.

4. The elastic wave device according to claim 3, wherein the second conductive layer is made of a metal selected from the group consisting of Pt, Au, Cu, Ag, and Pd or an alloy containing one or more metals selected from the group consisting of Pt, Au, Cu, Ag, and Pd.

5. The elastic wave device according to claim 1, wherein the elastic wave device is a surface acoustic wave device.

6. The elastic wave device according to claim 1, wherein the elastic wave device is a boundary acoustic wave device.

7. The elastic wave device according to claim 1, wherein the piezoelectric substrate is a $LiNbO_3$ substrate, a $LiTaO_3$ substrate, a quartz substrate.

8. The elastic wave device according to claim 1, wherein the groove is trapezoidal in lateral cross-section.

9. The elastic wave device according to claim 8, wherein the groove has a base angle of about 45° to about 90°.

10. The elastic wave device according to claim 8, wherein the groove has a base angle of about 50° to about 80°.

11. The elastic wave device according to claim 1, further comprising a first dielectric layer arranged on the principal surface to cover the interdigital transducer electrode.

12. The elastic wave device according to claim 11, further comprising a second dielectric layer arranged on the first dielectric layer.

13. The elastic wave device according to claim 1, wherein the elastic wave device is a three medium-type boundary acoustic wave device.

14. The elastic wave device according to claim 1, wherein the elastic wave device is a two medium-type boundary acoustic wave device.

15. The elastic wave device according to claim 12, wherein the first dielectric layer has an acoustic velocity less than an acoustic velocity of the second dielectric layer.

16. The elastic wave device according to claim 1, wherein at least one portion of the interdigital transducer electrode is embedded in the groove.

17. The elastic wave device according to claim 1, wherein the laminate further includes an adhesive layer that is conductive or non-conductive.

18. The elastic wave device according to claim 1, wherein a shape of the first conductive layer corresponds to a shape of the groove.

19. The elastic wave device according to claim 1, wherein the first conductive layer includes a central portion including a surface parallel or substantially parallel to a bottom surface of the groove and two side portions which are located on widthwise end portions of the groove, which include surfaces parallel or substantially parallel to side surfaces inclined relative to the bottom surface and which are inclined relative to the bottom surface.

20. The elastic wave device according to claim 1, wherein the diffusion-preventing layer is made of titanium oxide, titanium nitride, titanium oxynitride, chromium oxide, chromium nitride, or chromium oxynitride.

* * * * *